United States Patent [19]
Liu et al.

[11] Patent Number: 6,108,680
[45] Date of Patent: *Aug. 22, 2000

[54] SYSTEM AND METHOD FOR FILTERING USING AN INTERLEAVED/RETIMED ARCHITECTURE

[75] Inventors: Lynette C. Liu, Cagnes-sur-Mer, France; Toshiaki Yoshino, Tsukuba Ibaraki, Japan

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/220,410

[22] Filed: Mar. 30, 1994

Related U.S. Application Data

[63] Continuation of application No. 08/083,211, Jun. 25, 1993, abandoned, which is a continuation of application No. 07/814,852, Oct. 30, 1991, abandoned.

[51] Int. Cl.[7] ........................................................ G06F 17/10
[52] U.S. Cl. ............................ 708/317; 708/316; 708/318
[58] Field of Search ...................... 364/724.13, 724.14, 364/724.15; 708/317, 318, 316

[56] References Cited

U.S. PATENT DOCUMENTS

| | | | |
|---|---|---|---|
| 3,629,509 | 12/1971 | Glaser | 364/724.13 |
| 4,192,008 | 3/1980 | Mandeville | 364/724.14 |
| 4,378,469 | 3/1983 | Fette | 364/724.15 |
| 4,389,538 | 6/1983 | White | 364/724.13 |
| 4,398,262 | 8/1983 | Williams | 364/724.15 |
| 4,700,323 | 10/1987 | Renner | 364/724.15 |
| 4,716,537 | 12/1987 | Schevermann | 708/317 |
| 4,811,263 | 3/1989 | Hedley et al. | 364/724.13 |
| 4,893,265 | 1/1990 | Hirosaki | 364/724.13 |
| 5,016,207 | 5/1991 | Fujii et al. | 364/724.13 |

*Primary Examiner*—David H. Malzahn
*Attorney, Agent, or Firm*—W. Daniel Swayze, Jr.; W. James Brady, III; Frederick J. Telecky, Jr.

[57] ABSTRACT

An interleaved all-pass section for a lattice wave digital filter, comprises a first input carrying an interleaved signal, a first adder/multiplier network (AMN) connected to said first input, a second adder/multiplier network (AMN), and a delay element connected between said first AMN and said second AMN, wherein said delay element causes the propagation of signals from said first AMN to said second AMN to be delayed sufficiently to enable said second AMN and said first AMN to process separate signals in parallel.

3 Claims, 4 Drawing Sheets

SYSTEM AND METHOD FOR FILTERING USING AN INTERLEAVED/RETIMED ARCHITECTURE

This application is a Continuation of application Ser. No. 08/083,211, filed Jun. 25, 1993 now abandoned, which is a continuation of Ser. No. 07/814,852 filed Oct. 30, 1991 now abandoned.

CROSS-REFERENCE TO RELATED APPLICATIONS

The following coassigned patent applications are hereby incorporated herein by reference:

| Ser. No. | Filing Date | TI Case No. |
| --- | --- | --- |
| 4,577,282 | 2/22/82 | TI-09062 |
| 4,912,636 | 3/13/87 | TI-11961 |
| 5,072,418 | 5/04/89 | TI-14080 |

BACKGROUND OF THE INVENTION

1. Field of the Invention

This invention relates to digital filters, and in particular to interleaved/retimed architectures for the lattice wave digital filter.

2. Description of the Related Art

In its most general form, a lattice wave digital filter (LWDF), which is one type of an infinite impulse response (IIR) filter, is composed of two branches of cascaded all-pass sections, as shown in the illustration in FIG. 1. $A_1(z)$ is a first-order all-pass section and each of the other $A_n(z), B_m(z)$ are second-order all-pass sections. Previous hardware implementations of the LWDF of FIG. 1 use the traditional structure (FIG. 2) or the bireciprocal structure (not shown) for the first- and second-order sections. While the traditional architecture can implement any filtering function, it has twice the hardware of the bireciprocal case. The bireciprocal filter is attractive in terms of hardware but is limited to halfband filtering functions. None of the previous approaches offers a solution that minimizes the hardware without restricting the transfer function characteristics. Thus, a problem with previous LWDF architectures is the trade-off between hardware size and transfer function characteristics. Accordingly, improvements which overcome any or all of these problems are presently desirable.

SUMMARY OF THE INVENTION

In accordance with one embodiment, the invention is incorporated into a lattice wave digital filter (LWDF), in which an all-pass section is configured to process more than one input signal at a time. For example, the all-pass section is provided with two input signals connected to a multiplexor. On alternating processing cycles the signals are fed by the multiplexor to a first adder/multiplier network. The first adder/multiplier network is connected to a second adder/multiplier network. The connecting paths as well as paths between the output and input of at least one adder/multiplier network are provided with delay elements, thereby controlling the timing of the all-pass sections and enabling one signal to be processed in one region of the all-pass section while another region of the all-pass section is processing a second signal. The output from the all-pass section alternates between the output corresponding to the first and second input signals. This output is alternatively selected by a demultiplexor.

In a second embodiment, an all-pass section has the additional feature of being able to process two input signals with two independent transfer functions. In this embodiment, separate multipliers are provided for each multiplication factor in each of the transfer functions. These multipliers are multiplexed, thereby enabling the all-pass section to alternate between multiplication coefficients, as may be appropriate.

It is an objective of the invention to provide an all-pass section to reduce hardware size of a lattice wave digital filter without sacrificing filtering features.

It is a second objective of the invention to provide an all-pass section which can process multiple input signals simultaneously, i.e., having one part of the all-pass section process a first signal while another part of the all-pass section processes a second signal.

It is an additional objective of the invention to provide an all-pass section which can process multiple input signals with independent transfer functions simultaneously.

Other objects, features, and advantages of the invention will become more apparent from the following description when taken in conjunction with the accompanying drawings.

BRIEF DESCRIPTION OF THE DRAWINGS

FIG. 3($b$) is a schematic of an interleaved/retimed second-order all-pass section in accordance with another embodiment of the invention.

FIG. 5($b$) shows a schematic of an interleaved/retimed fifth-order LWDF according to a preferred embodiment.

DESCRIPTION OF THE PREFERRED EMBODIMENTS

Figure 1:
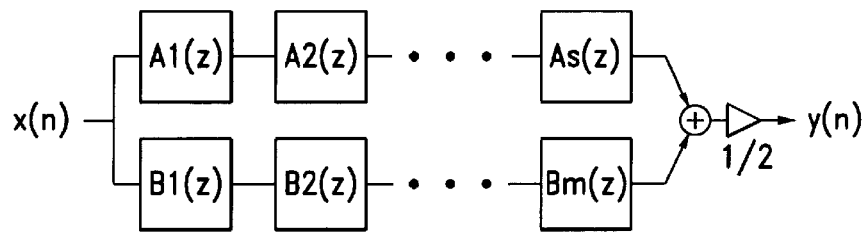
FIG. 1 shows a block diagram of the cascade of all-pass sections for a lattice wave digital filter (LWDF), one type of an infinite impulse response (IIR) digital filter.
Figure 2:
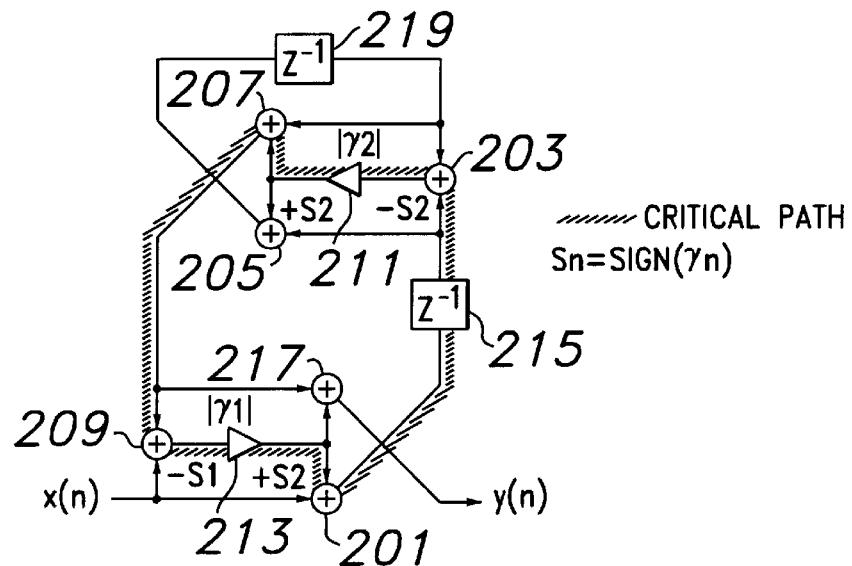
FIG. 2 shows the traditional structure for a second-order lattice wave digital filter (LWDF) all-pass section.

FIG. 2 shows an example structure of a second-order all-pass LWDF section. Input x(n), for example the output of an analog-to-digital converter, is connected to adders 201 and 209. Adder 201 is connected to delay element 215, which in turn has outputs connected to adders 203 and 205. The output of adder 203 is connected to multiplier 211. The output of multiplier 211 is connected to both adder 205 and adder 207. Whereas, the output of adder 207 is fed as an input to adder 209 and adder 217, the output of 205 is transferred via delay element 219 into the second input of adders 207 and 203. The output of adder 209 is connected to multiplier 213, whose outputs are fed into adders 201 and 217. The output of adder 207 is also fed into adder 217. The output of adder 217 is connected to the circuit output y(n). The delay elements 215 and 219 serve the purpose of timing the propagation of signals through the all-pass section.

The shaded path in FIG. 2 shows the critical path through the all-pass section. The critical path begins and ends at register 215 and is the path from circuit element 215 to 203 to 211 to 207 to 209 to 213 to 201 and back to element 215. The critical path is "critical" in the sense that it is the path with the highest number of computations. The computations on the critical path should be completed before the next input can be processed by the all-pass section.

Figure 3A:
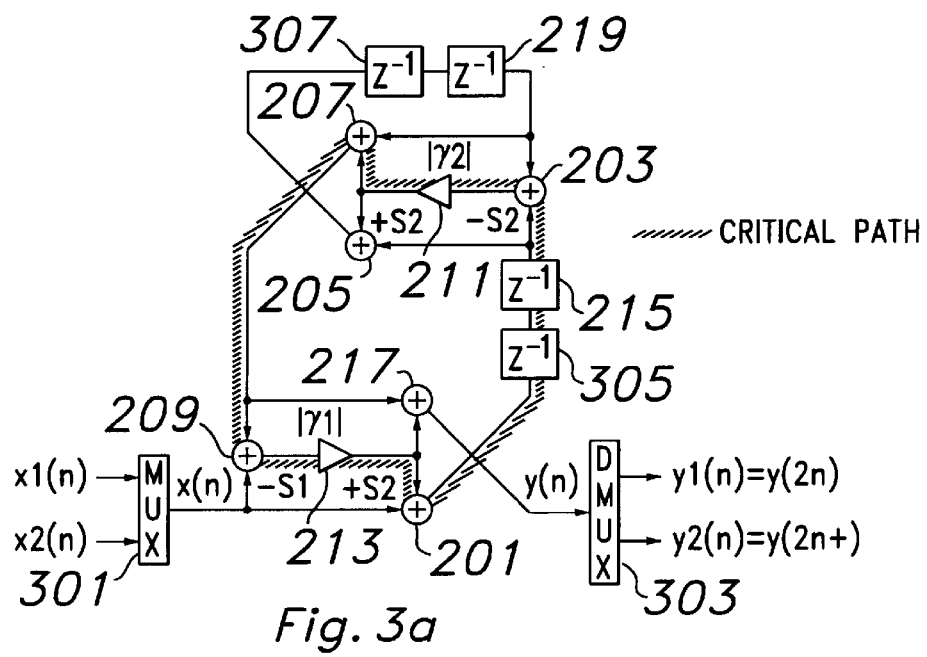
FIG. 3($a$) is a schematic of an interleaved second-order all-pass section in accordance with one embodiment of the invention.
Figure 3B:
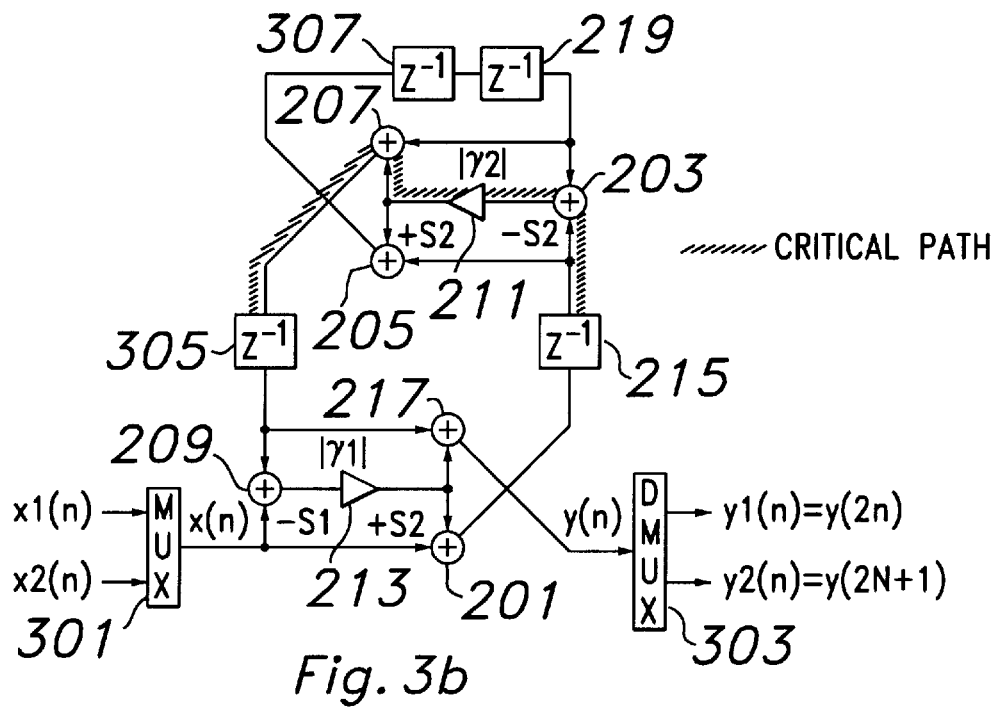

FIG. 3(*a*) shows a preferred embodiment LWDF architecture which makes use of pipeline interleaving. Pipeline interleaving is discussed in K. Parhi, "Algorithm transformation techniques for concurrent processors," *Proc. IEEE*, vol. 77, pp. 1879–1895, December 1989. The following transformations are used to modify the traditional second-order all-pass section, shown in FIG. 2, to filter two signals at the same time without loss of throughput. Referring to FIG. 2, it can be seen that the clock rate is limited by the critical path of four adders, 201, 203, 207 and 209 and two multipliers, 211 and 213. This clock rate can be estimated as $$F_c = \frac{1}{4 \times t_{add} + 2 \times t_{mult}} \quad (1)$$

where $t_{add}$ is the delay through one adder and $t_{mult}$ is the delay through one multiplier. Both the input and output can have a maximum sample rate of $F_c$.

By applying the concept of pipeline interleaving, two input signals can be processed with the second-order section by multiplexing the two signals at the input and doubling each of the delay elements of FIG. 2. To process two signals simultaneously through the circuit shown in FIG. 3(*a*), the samples must be interleaved in time. This may be achieved with the use of multiplexor 301 which interleaves the signals x1(n) and x2(n) to obtain the signal x(n). This improved architecture is shown in FIG. 3(*a*). This modification of the circuit in FIG. 2 consists of the addition of delay element 305 on the connection from adder 201 to delay element 215 and by the addition of delay element 307 on the connection between adder 205 and delay element 219. The critical path remains the same with the addition of delay elements 305 and 307.

Whereas, the circuit in FIG. 2 only has one input and one output, the circuit in FIG. 3(*a*) is augmented with one additional input and output. Thus, the circuit in FIG. 3(*a*) has inputs x1(n) and x2(n), and corresponding outputs y1(n) and y2(n).

The inputs x1(n) and x2(n) are fed into multiplexor 301, the output of which takes the place of input x(n) of FIG. 2. Similarly, the output y(n) is an interleaved version of y1(n) and y2(n), and may be demultiplexed by demultiplexor 303 to yield y1(n) and y2(n).

In FIG. 3(*a*) (and in FIGS. 3(*b*) and 4, discussed below), multiplexing of the input signals x1(n) and x2(n) and the corresponding demultiplexing of output signal y(n) demonstrates that the signals x(n) and y(n) are both interleaved signals. A person skilled in the art will realize that interleaving of the signals may be achieved in many other ways.

The transfer function with respect to both inputs remains the same where $$H(z) = \frac{Y_1(z)}{X_1(z)} = \frac{Y_2(z)}{X_2(z)}, \quad (2)$$

as shown in FIG. 3(*a*). The filtering of one signal is completely independent of the filtering of the other, resulting in each signal appearing as if it were filtered through separate hardware. However, the maximum sample rate of each of the inputs in the circuit of FIG. 3(*a*) is restricted to $F_c/2$ due to the multiplexing. To regain the original sample rate, the extra delays can be retimed as shown in FIG. 3(*b*), thus producing an Interleaved/Retimed (IR) all-pass section. Retiming is discussed in C. Leiserson and J. Saxe, "Optimizing synchronous systems," *J. VLSI Comp. Syst.*, vol. 1, pp. 41–67, 1983. These two techniques, pipeline interleaving and retiming, can be used to exploit the inherent symmetry in the traditional LWDF structure to eliminate many adders.

The circuit shown in FIG. 3(*b*) is retimed with respect to the circuit of FIG. 3(*a*) by moving the various delay elements to other locations in the circuit. For example, delay element 305 has been moved from the path between adder 201 and delay element 215 and inserted on the output path from element 207, prior to the point at which the output is branched to adder 209 and adder 217.

Thus, the critical path for the circuit in FIG. 3(*b*) is $$F_{cr} = \frac{1}{2 \times t_{add} + t_{mult}} = 2 \times F_c. \quad (3)$$

This twofold increase in clock rate allows multiplexing of two signals while maintaining a sample rate of $F_c$ for each signal. Thus by doubling the delay elements and applying retiming, the same second-order section can be used to filter two independent signals with no loss in throughput.

Figure 4:
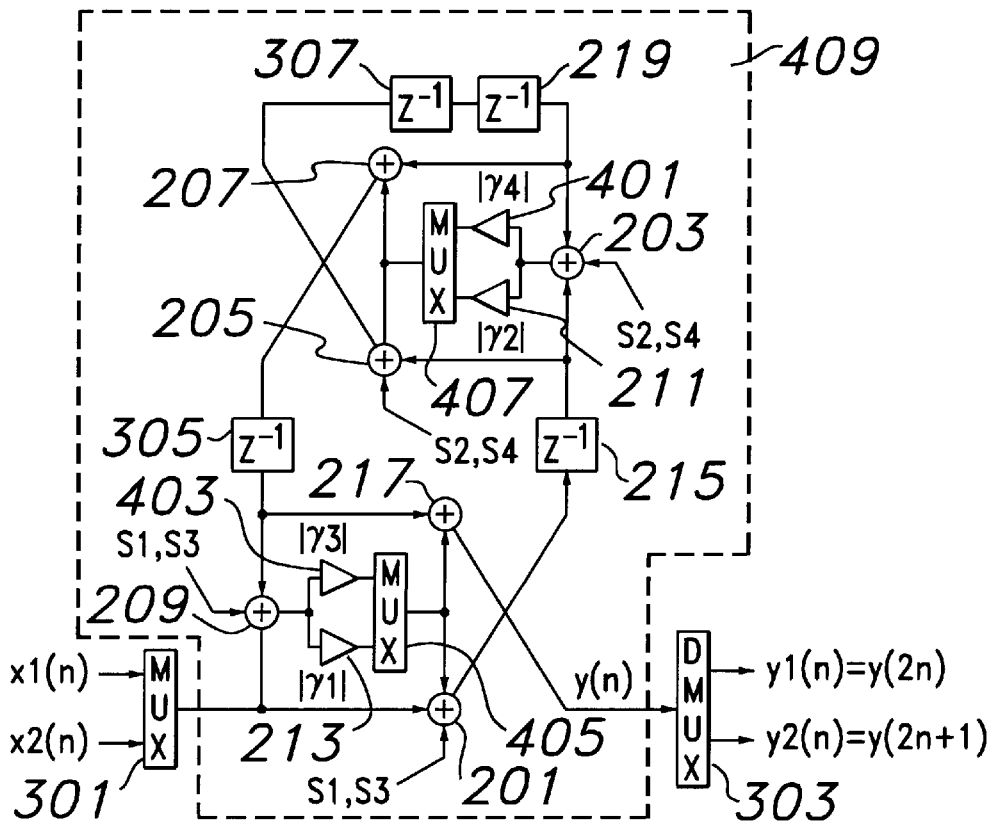
FIG. 4 shows a schematic in which two second-order all-pass section are multiplexed for the simultaneous processing of two signals with independent transfer functions, according to a preferred embodiment.

FIG. 4 shows a modification to the structure of FIG. 3(*b*), using one additional transformation. Thus modified, the circuit can filter two input signals with two independent transfer functions, $H_1(z)$ and $H_2(z)$. This is accomplished by providing separate multipliers for each of the four multiplier coefficients, $\gamma_1$, $\gamma_2$ corresponding to $H_1(z)$ and $\gamma_3$, $\gamma_4$ corresponding to $H_2(z)$. The output from adder 203 is fed into multiplier 401 as well as into multiplier 211. Similarly, the output from adder 209 is fed into multiplier 403 as well as into multiplier 213. On a given clock cycle the appropriate multiplier output, either from multiplier 403 or multiplier 213, is selected by multiplexor 407. Similarly, the outputs from multipliers 403 and 213 are alternatively selected by multiplexor 405. The only other change is the inclusion of a control signal, $s_i$, to adders 201, 203, 205 and 209 in each second-order section, which determines whether an addition or subtraction is performed.

Thus, by doubling the delay elements and multipliers, and introducing a minimal number of multiplexors, the IR section in FIG. 4 realizes two different second-order sections, $H_1(z)$, $H_2(z)$, without a decrease in sample rate for either of the inputs. Note that the Interleaved/Retimed (IR) second-order section time multiplexes its adders and has half the adders needed by a traditional LWDF implementation. As a person skilled in the art will realize, the same procedure can be applied to the first-order section.

A traditional fifth-order LWDF is shown in FIG. 5(*a*). Each traditional second-order section 501 and 503, whether in the top or bottom branch, is identical except for their multiplier coefficient values, $\gamma_1$, $\gamma_2$, $\gamma_3$ and $\gamma_4$, respectively. The top traditional second-order section 501 is preceded by a first-order section 505 having its output connected to delay element 527, which in turn is connected to the input of second-order section 501. The input to the circuit is branched and fed to the input of the first-order section 505 and to the input of the second-order section 503, via delay element 533. The outputs from second-order section 501 and second-order section 503 are connected to delay elements 529 and 531, respectively, the outputs from which are fed to adder 507. The output from adder 507 is input to multiplier 509; from which the output from the filter is taken. The delay registers 527–531 are used to pipeline the feed-forward path such that the critical path is restricted to within a second-order section.

Figure 5A:
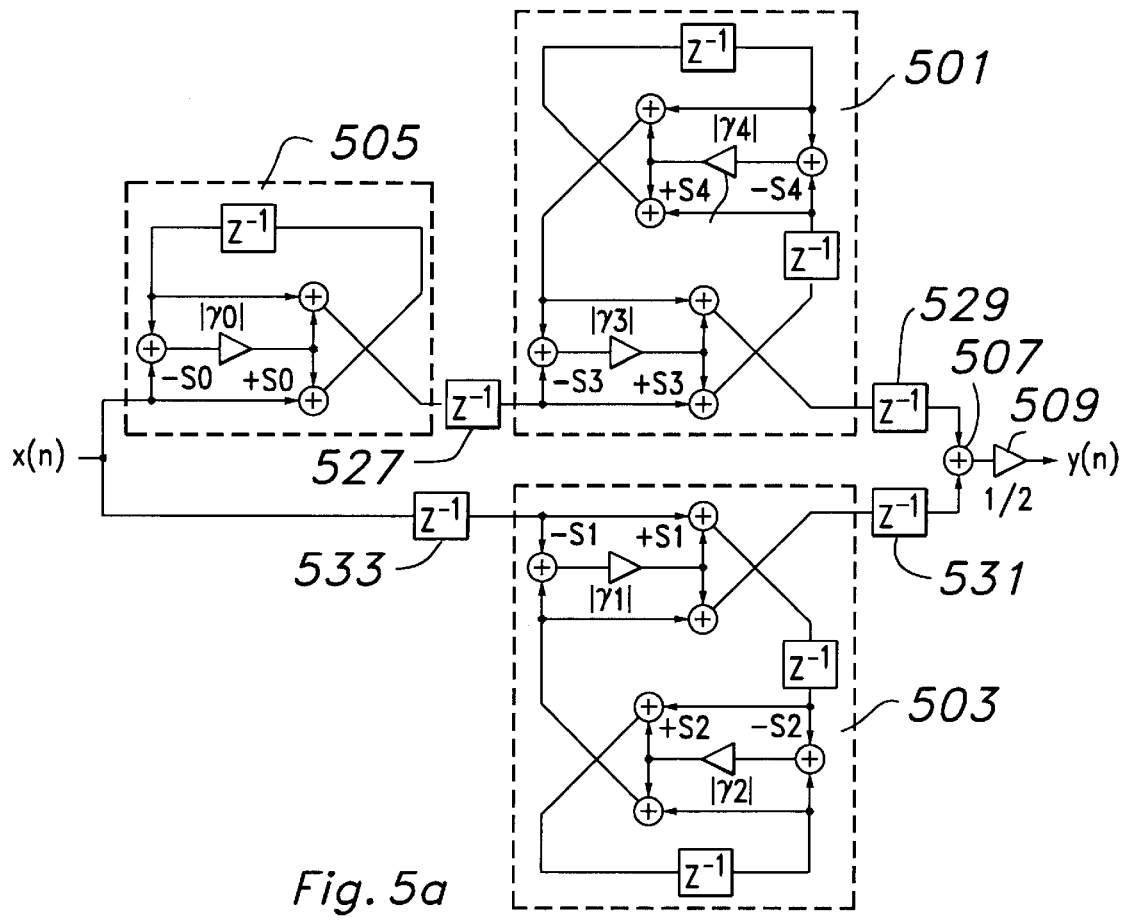
FIG. 5($a$) shows a schematic of a traditional structure of a fifth-order lattice digital wave filter (LWDF).
Figure 5B:
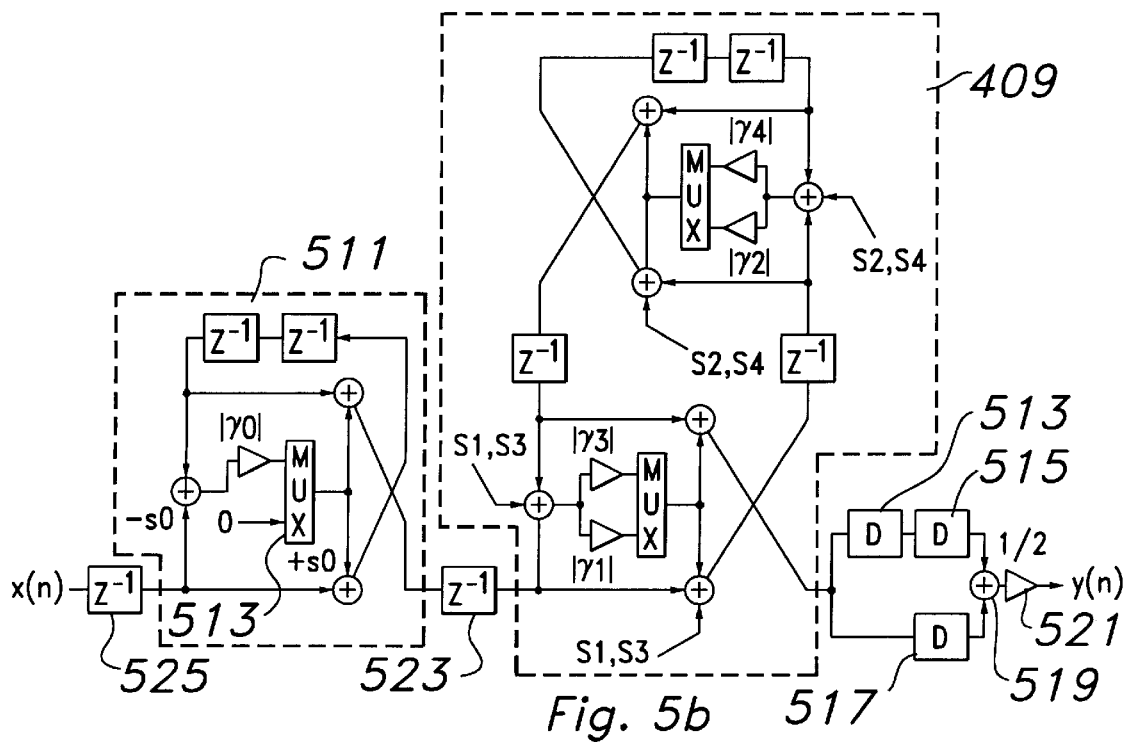

The results discussed above in conjunction with FIG. 4 can be applied to combine pairs of second-order sections in the top and bottom branches to yield the fifth-order filter shown in FIG. 5(b). The first-order section 505 in the top branch has been combined with the wire in the bottom branch to obtain the first-order interleaved/retimed (IR) section 511. A delay element 525 samples the input x(n) at twice its sample rate in order to produce an interleaved signal corresponding to x1(n) and x2(n) in FIG. 5(a). The second-order section 501 in the top branch has been combined with the second-order section 503 in the bottom branch using the IR second-order section shown in FIG. 4. The inputs to the two second-order sections of FIG. 5(a) are effectively multiplexed after passing through the first-order section 511 in FIG. 5(b). A delay register 523 is connected between the first-order section 511 and the second-order section 409. This register is used to pipeline the feed-forward path such that the critical path is restricted to within a second-order section.

Because the inputs to the top and bottom branches of FIG. 5(a) are the same, an input register 525 that samples the filter input at two times its incoming rate is used to produce the two "multiplexed" input signals. The traditional first-order section 505 is transformed into the first-order section 511, in a similar fashion as the traditional second-order section. However, since there is no corresponding first-order section in the bottom branch, one of the multiplier coefficients has a value of zero, as indicated at the input to multiplexor 513. This implies that on every other clock cycle, the input passes through the transformed first-order section unaltered, which is consistent with the connection in the bottom branch of FIG. 5(a). The input x(n) is connected to delay element 525. The output from delay element 525 is fed into first-order all-pass section 511. The output from all-pass section 511 is fed into delay element 523, the output of which is fed into the second-order all-pass section 409.

At the output, the interleaved stream is split into two streams and demultiplexed by the use of three registers 513, 515 and 517, one to offset the two streams by one $1/F_{cr}$ s, and two that operate at $F_{cr}/2$ Hz to allow the summing by adder 519 and output from the filter at $F_c$ Hz, where $F_c=\frac{1}{2}F_{cr}$. Delay elements 515 and 517 operate at the clock rate $F_{cr}$ and the delay element 513 operates at the clock rate $F_c$. The outputs of the two delays that operate at the slower clock frequency correspond to the output of the top and bottom branches in FIG. 5(a). Note that the Interleaved/Retimed (IR) structure of FIG. 5(b) performs the identical function as the traditional structure of FIG. 5(a) with the same sample rate, but requires only 40% of the adders.

By exploiting the symmetry of the LWDF structure and the interleaved processing of the all-pass sections, a hardware reduction can be achieved through the transformation of the circuit shown in FIG. 5(a) into the circuit shown in FIG. 5(b). If canonic signed digit (CSD) multipliers are used to implement the multiplications, the savings in adder hardware is significant using the IR structure presented in the above described embodiments. A total hardware reduction of 30-45% may be achieved. Table I compares the chip areas of fifth- and ninth-order filters using cells from a 0.8-$\mu$m BiCMOS gate array library and CSD multipliers with up to three CSD bits per multiplier. As the filter order increases, the area of the IR structure approaches that of the bireciprocal, without restrictions in transfer function.

TABLE 1

Approximate Chip Areas (mm$^2$) for three LWDF Structures

| Filter Order | PRIOR ART | | Interleaved/Retimed (IR) (According to the preferred embodiment) |
|---|---|---|---|
| | Bireciprocal | Traditional | |
| 5 | 2.8 | 6.2 | 4.2 |
| 9 | 5.3 | 10.86 | 6.7 |
| Transfer Function Restriction | halfband | none | none |

The LWDF has been shown to have very nice properties for infinite impulse response (IIR) filtering applications. For fixed coefficient filters using CSD multipliers, the integrated circuit chip area of an LWDF is dominated by the adders. Application of the concept of pipeline interleaving and retiming to the traditional LWDF structure allows its inherent symmetry to be utilized to reduce the number of adders in the structure by almost 50%. Actual chip design shows that an area savings of 30–40% can be achieved without loss of throughput by using the described IR LWDF structure of the present invention.

Figure 6:
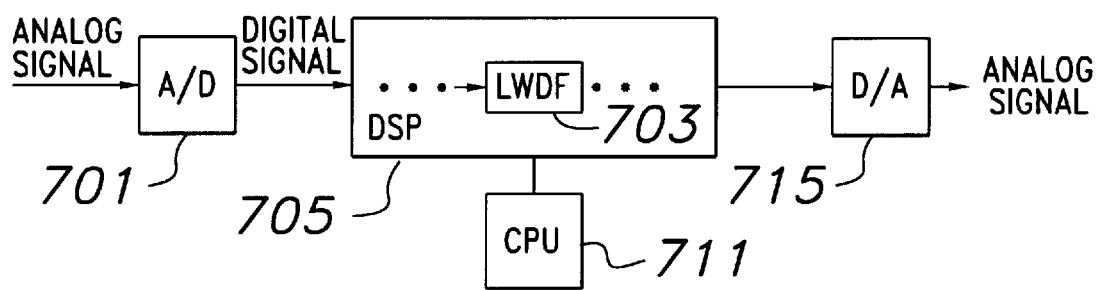
FIG. 6 shows a block diagram of a computer system which incorporates an LWDF in accordance with the invention.

FIG. 6, shows an example system architecture which contains the improved lattice wave digital filter (LWDF) according to the preferred embodiment. A person skilled in the art will realize other system configurations, in which the preferred embodiment described above may be utilized to reduce the hardware size for the LWDF. In FIG. 6, a digital signal processor (DSP) 705 accepts input from an analog-to-digital (A/D) converter 701. The DSP 705 includes a LWDF, for example the LWDF shown in FIG. 5. The A/D 201 converts an analog signal into a digital representation. The processed signal is output from the DSP 705 and is fed into a digital-to-analog (D/A) converter 715, where the digital signal is converted back to the analog domain. The DSP 705 interacts with and may be controlled by a CPU 711.

While this invention has been described with reference to a few illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A lattice wave digital filter, comprising:

an input means for inputting an interleaved signal;

at least one adder/multiplier network (AMN) connected to said input means, and wherein said one adder/multiplier network comprises:

a first adder having a first output, a first multiplier and a second multiplier, each of said first multiplier and said second multiplier being connected to said first output of said first adder, and a multiplexer connected to each of said first multiplier and second multiplier and operable to alternatively select an output from one of said first or second multipliers.

2. The lattice wave digital filter of claim 1, wherein said lattice wave digital filter further comprises a multiplexor having a first input, a second input, and a first output, wherein said first output is connected to said input means.

3. The lattice wave digital filter of claim 1, wherein said AMN further comprises an second adder coupled to said first adder having a mode selection input to switch said second adder between a subtraction mode and an addition mode.

* * * * *